(12) United States Patent
Wagner et al.

(10) Patent No.: US 11,876,517 B2
(45) Date of Patent: Jan. 16, 2024

(54) ADAPTIVE KEEPER FOR SUPPLY-ROBUST CIRCUITS

(71) Applicant: International Business Machines Corporation, Armonk, NY (US)

(72) Inventors: Israel A. Wagner, Zichron Yaakov (IL); Elazar (Eli) Kachir, Tel-Aviv (IL)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 17/669,761

(22) Filed: Feb. 11, 2022

(65) Prior Publication Data

US 2023/0261660 A1 Aug. 17, 2023

(51) Int. Cl.
*H03K 19/20* (2006.01)
*H03K 19/096* (2006.01)

(52) U.S. Cl.
CPC ................. *H03K 19/0963* (2013.01)

(58) Field of Classification Search
CPC .................................................. H03K 19/0963
See application file for complete search history.

(56) References Cited

U.S. PATENT DOCUMENTS

| | | | | |
|---|---|---|---|---|
| 6,707,318 B2 * | 3/2004 | Kumar | ............... | H03K 19/0963 326/98 |
| 7,109,757 B2 * | 9/2006 | Yuan | ........................ | G11C 7/12 326/119 |
| 7,282,960 B2 * | 10/2007 | Belluomini | ........ | H03K 19/0963 326/97 |
| 7,332,937 B2 | 2/2008 | Hsu et al. | | |
| 7,411,425 B2 * | 8/2008 | Belluomini | ........ | H03K 19/0016 326/98 |
| 8,362,806 B2 | 1/2013 | Wijeratne et al. | | |
| 9,537,485 B2 | 1/2017 | Puckett et al. | | |
| 2004/0051561 A1 | 3/2004 | Gauthier et al. | | |
| 2007/0146013 A1 | 6/2007 | Hsu et al. | | |
| 2007/0176642 A1 * | 8/2007 | Kursun | .............. | H03K 19/0966 326/98 |
| 2008/0111616 A1 | 5/2008 | Cheng et al. | | |

(Continued)

FOREIGN PATENT DOCUMENTS

WO 2008146299 A2 12/2008

OTHER PUBLICATIONS

Gnana et al., "Adaptive Keeper Design for Dynamic Logic Circuits Using Rate Sensing Technique," IEEE Transactions on Very Large Scale Integration (VLSI) Systems, vol. 19, No. 2, Feb. 2011, pp. 295-304.

(Continued)

*Primary Examiner* — Kurtis R Bahr
(74) *Attorney, Agent, or Firm* — Cantor Colburn LLP; Erik Johnson

(57) ABSTRACT

An electrical circuit includes a driver circuit, a receiver circuit, and a keeper circuit. The receiver circuit receives an input pulse from the driver circuit during a pre-charge phase. The receiver circuit generates an output pulse based on the input pulse during an evaluation phase. The keeper circuit maintains a charge of the output pulse until another evaluation phase, wherein the keeper circuit is adapted to the driver circuit by gating a first voltage supply of the driver circuit with a second voltage supply of the keeper circuit.

18 Claims, 3 Drawing Sheets

(56) References Cited

U.S. PATENT DOCUMENTS

| | | |
|---|---|---|
| 2008/0116938 A1* | 5/2008 | Ngo .................. H03K 19/0013 326/95 |
| 2008/0129346 A1 | 6/2008 | Cheng |
| 2010/0327909 A1 | 12/2010 | Wijeratne et al. |
| 2016/0099713 A1 | 4/2016 | Puckett et al. |

OTHER PUBLICATIONS

Kursun et al., "Domino Logic With Variable Threshold Voltage Keeper," IEEE on Very Large Scale Integration (VLSI) Systems, vol. 11, No. 6, Dec. 2003, pp. 1080-1093.

* cited by examiner

ADAPTIVE KEEPER FOR SUPPLY-ROBUST CIRCUITS

BACKGROUND

Aspects disclosed herein relate to electrical circuits and more specifically to adaptive keeper circuits of the electrical circuits, the adaptive keeper circuits facilitating dynamic adjustments in response to variations in electric supply applied to the electrical circuits.

Keeper circuits are commonly used in dynamic electrical circuits (e.g., logic gates, drivers, registers, etc.). Dynamic circuits have an evaluate node that is charged to a High level during a pre-charge phase and then during an evaluation phase, they are allowed to discharge (Low) or remain charged (High), depending on the input state(s) of input values for one or more pull down devices, which are coupled to the evaluate node. Keeper circuits are designed to assist in "keeping" the evaluate node charged High if it is supposed to evaluate High. Here, "Low", "High" are predetermined electrical values, e.g., current, voltage, etc.

SUMMARY

According to one or more embodiments of the present invention, an electrical circuit includes a driver circuit, a receiver circuit, and a keeper circuit. The receiver circuit receives an input pulse from the driver circuit during a pre-charge phase. The receiver circuit generates an output pulse based on the input pulse during an evaluation phase. The keeper circuit maintains a charge of the output pulse until another evaluation phase, wherein the keeper circuit is adapted to the driver circuit by gating a first voltage supply of the driver circuit with a second voltage supply of the keeper circuit.

According to one or more embodiments of the present invention, a method includes providing, by a driver circuit, an input pulse to a receiver circuit during a pre-charge phase. Further, the method includes generating, by the receiver circuit, an output pulse based on the input pulse during an evaluation phase. Further, the method includes keeping, by a keeper circuit, a charge of the output pulse until another input pulse is received by the receiver circuit, wherein the keeper circuit is adapted to the driver circuit by gating a first voltage supply of the driver circuit with a second voltage supply of the keeper circuit.

According to one or more embodiments of the present invention, a keeper circuit includes a first voltage supply, a second voltage supply, and a node that gates the first voltage supply and the second voltage supply, wherein the keeper circuit keeps a value of an output pulse of a dynamic circuit based on the gated first voltage supply and the second voltage supply.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

A "dynamic circuit" is an electrical circuit whose output is triggered by an input clock signal applied to the dynamic circuit. A dynamic circuit typically has two separate phases, an evaluation phase and a pre-charge phase. The value of the clock signal dictates the phases. For example, the clock signal can have a "High" value (i.e., a "1") or a "Low" value (i.e., a "0").

Typically, when the clock signal applied has the high value, the dynamic circuit is in evaluation phase. In evaluation phase, the logic of the dynamic circuit is evaluated using the inputs to the dynamic circuit. In the evaluation phase, the output of the dynamic circuit depends upon the evaluation of the logic of the dynamic circuit using the inputs applied to the dynamic circuit. Further, when the clock signal applied to the dynamic circuit has a low value, the dynamic circuit is in pre-charge phase. In pre-charge phase, the logic of the dynamic circuit is not evaluated. The output of a dynamic circuit in pre-charge mode is driven to the low value, since the logic of the dynamic circuit is not being evaluated.

Keeper circuits are designed to assist in "keeping" the output of the logic of the dynamic circuit High if the output is supposed to evaluate High. Therefore, a keeper circuit has to be strong enough to resist noise, leakage, etc. that would otherwise cause the node to errantly discharge to a Low value. At the same time, however, they should be weak enough to allow the evaluate node to quickly discharge when it is supposed to discharge. Here, "Low", "High" are predetermined electrical values, e.g., current, voltage, etc.

Figure 1:
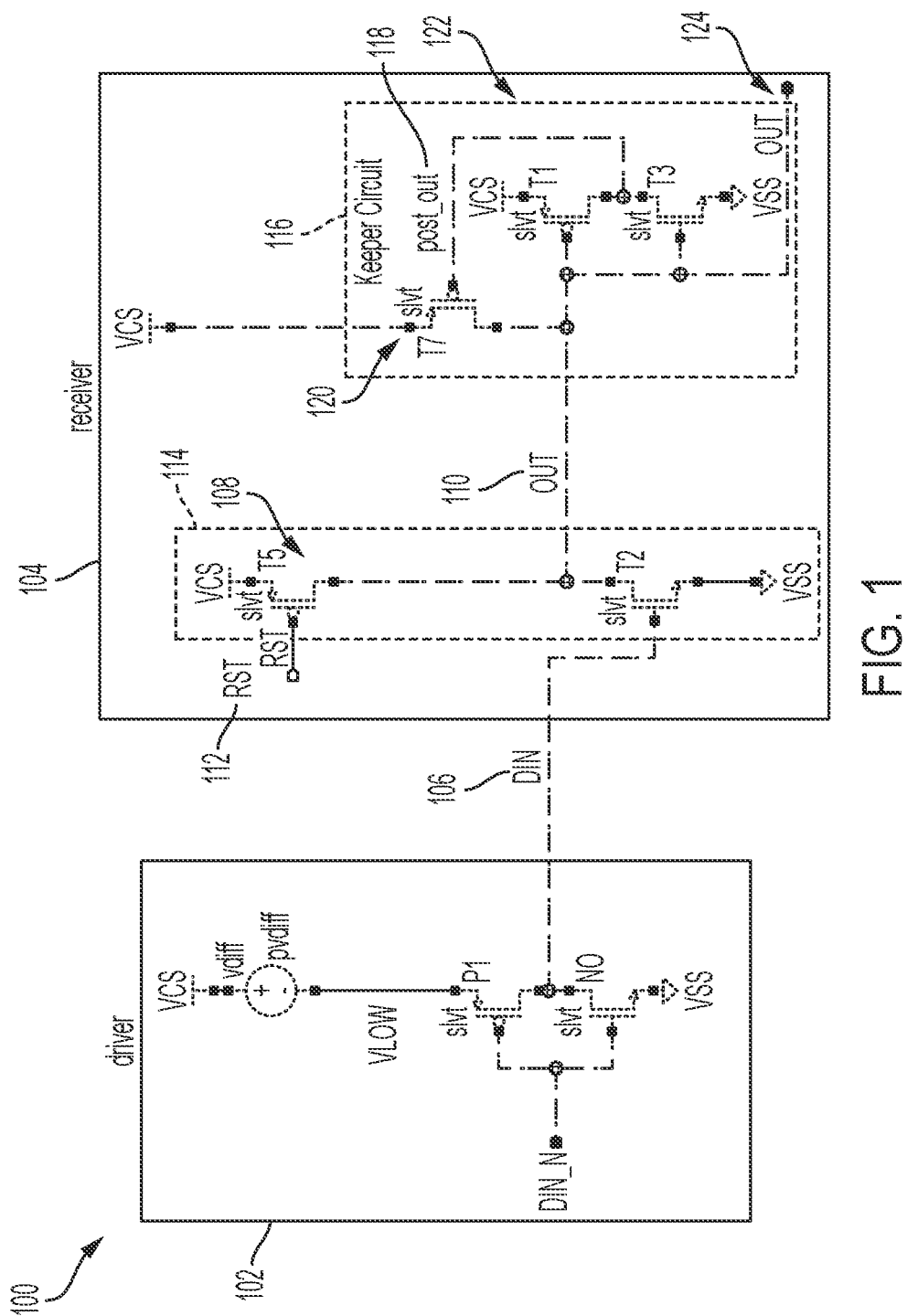
FIG. 1 depicts a dynamic circuit with a keeper circuit according to one or more embodiments of the present invention.

FIG. 1 depicts a dynamic circuit with a keeper circuit according to one or more embodiments of the present invention. It is understood that FIG. 1 depicts an illustrative dynamic circuit and that in one or more embodiments of the present invention, the dynamic circuit can be different from that depicted.

In FIG. 1, the dynamic circuit 100 includes a driver circuit 102 and a receiver circuit 104. The driver circuit 102 provides driver inputs 106 to the receiver circuit 104. It should be noted that the dynamic circuit 100 can be a portion of a larger circuit, such as a memory circuit, a register bank, etc., which are used in integrated circuits, for example. in one or more embodiments of the present invention, the driver circuit 102 is a "previous stage" of the receiver circuit 104, which uses the input from the driver circuit 102 to provide an output 124.

Further, the receiver circuit 104 includes a dynamic node 108 (sometimes referred to as evaluation node). The evaluated output 110 of the dynamic circuit is determined by an evaluation node 114 based on the driver inputs 106 and a clock signal (RST) 112. A keeper circuit 116 is used to support the dynamic node "OUT" (124) of the dynamic circuit 100 to keep its logical value after DIN input (106) has ended. The keeper circuit 116 includes a pull-up transistor 120 (device T7), and a pull-down node 122 (devices T0, T1). The pull-up device 120 can cause the final output 124 of the dynamic circuit 100 to be high if the evaluated output 110 is high, and the pull-down node 122 causes the final output 124 to be low if the evaluated output 110 is low.

However, a technical challenge exists where, the input amplitude of the driver inputs 106, driving the input device T2, may vary (e.g., due to cross-supply transition, IR voltage drop, large mismatch) between the driver circuit 102 and the receiver circuit 104, and as a result the keeper circuit 116 may be too strong or too weak for keeping the post-output 118 charged at the desired value.

For example, in the depicted circuit, in the pre-charge phase, when RST=0, it causes the evaluated output 110 OUT=VCS (i.e., high, or 1). The keeper circuit 116 causes the output 124 to stay high. Further, during the evaluate phase, if the RST=0, and if the driver inputs 106 DIN=1, it causes the evaluated output 110 OUT=0, however, the keeper circuit 116, because of a pull up node 120, can cause the output 124 to stay high.

The above discrepancy can occur if Vsupply(driver) <Vsupply(receiver), for example, due to cross-supply point, IR drop, and the driver input 106 DIN is too weak to pull-down the value of the evaluated output 110 OUT. Here, Vsupply(driver) is the voltage applied to the driver circuit 102, and Vsupply(receiver) is the voltage applied to the receiver circuit 104.

The size of the keeper circuit 116 can affect the supply voltages, which in turn cause such discrepancies. Typically, it is desirable to use a keeper circuit 116 whose size is large enough that the keeper circuit 116 provides enough current to an evaluation node to compensate for any current leaking from the evaluation node, but not so large as to unduly slow down the evaluation of the dynamic circuit 100, as larger keeper circuits 116 require additional time to transition from being turned on and off.

In addition, a technical challenge with a keeper circuit 116 that is not sized appropriately includes a pull-down failure in which the input pulse cannot pull the evaluated output 110 to low (0) that will change the final output 124 from the keeper circuit 116 (keeper too strong). Further, inappropriately sized keeper circuits 116 can also cause a pull-up failure, in which the keeper circuit 116 cannot guard the evaluated output 110 to a high value, prior to evaluation (keeper too weak).

Existing solutions to such technical challenge regarding appropriately sizing the keeper circuit 116 includes a dynamically adjustable keeper circuit, in which a controller calculates average input frequency (of the receiver circuit—"DIN" in this example) and matches the keeper size accordingly. In some solutions, the keeper circuit is completely closed (i.e., turned off) during the evaluation phase.

One or more embodiments of the present invention provide address the technical challenges regarding appropriately sizing the keeper circuit 116 by using an adaptive circuit that does not require a global, process-based controller, rather the adaptive circuit reacts to the actual voltage in the input, making the adaptation "automatic." Further, one or more embodiments of the present invention facilitate savings in area/wire congestion because the controller and the related connectivity can be avoided. The technical solutions provided by one or more embodiments of the present invention facilitate better robustness against local and global variations in input values. Further, the one or more embodiments of the present invention provide improved robustness in cases where the amplitude of the input to the receiver circuit (105 "DIN") is different from the voltage supply at the receiver circuit under test (114). Further, one or more embodiments of the present invention provide an improvement regarding the size of the adaptive circuit, which is smaller in comparison to the circuits that use a controller for dynamic adjustment of the keeper.

One or more embodiments of the present invention address the technical challenges by making the keeper circuit 116 partially dependent on the supply voltage of a previous stage in the dynamic circuit 100. As a result, the keeper circuit is dynamically made stronger for a high-voltage input, and weaker for low-voltage input.

Figure 2:
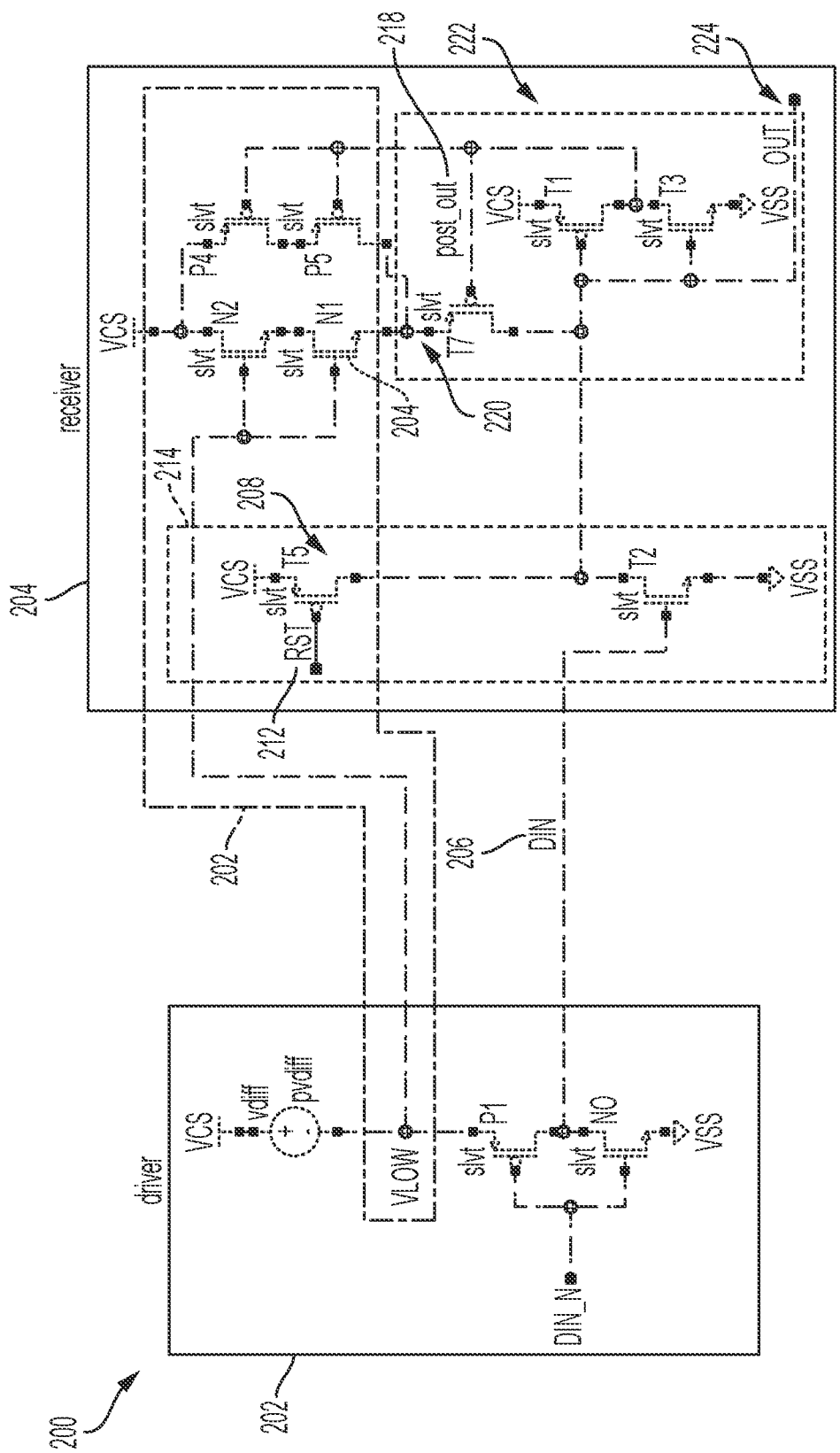
FIG. 2 depicts a dynamic circuit that uses an adaptive circuit to dynamically adjust the keeper circuit according to one or more embodiments of the present invention.

FIG. 2 depicts a dynamic circuit that uses an adaptive circuit to dynamically adjust the keeper circuit according to one or more embodiments of the present invention. The dynamic circuit 200 that is shown in FIG. 2 uses the same base structure as that of the dynamic circuit 100, for example, using the driver circuit 102 and the receiver circuit 104 that generates an output 124 based on inputs from the driver circuit 102. In addition, the dynamic circuit 200 includes an adaptive circuit 202.

The adaptive circuit 202 facilitates the keeper circuit 116 (node T7) of the dynamic stage (i.e., receiver circuit 104) to be supplied according to the voltage supply (e.g., "VLOW") of the previous stage (i.e., driver circuit 102), by gating the connections of the voltage supplies (VCS) through node 1 204 of the adaptive circuit 202. The node 1 204 is an N-Channel Field Effect Transistor (NFET) device in one or more embodiments of the present invention. In one or more embodiments of the present invention, one or more attributes of the NFET (e.g., by adjusting the NFET size or its threshold voltage (Vt)) can be controlled/tuned to optimize the gating of the voltage supplies. As a result of the gating, the keeper circuit 116 becomes stronger for a high-voltage input, and weaker for low-voltage input, in turn reducing the risk of pull-up or pull-down failures.

Figure 3:
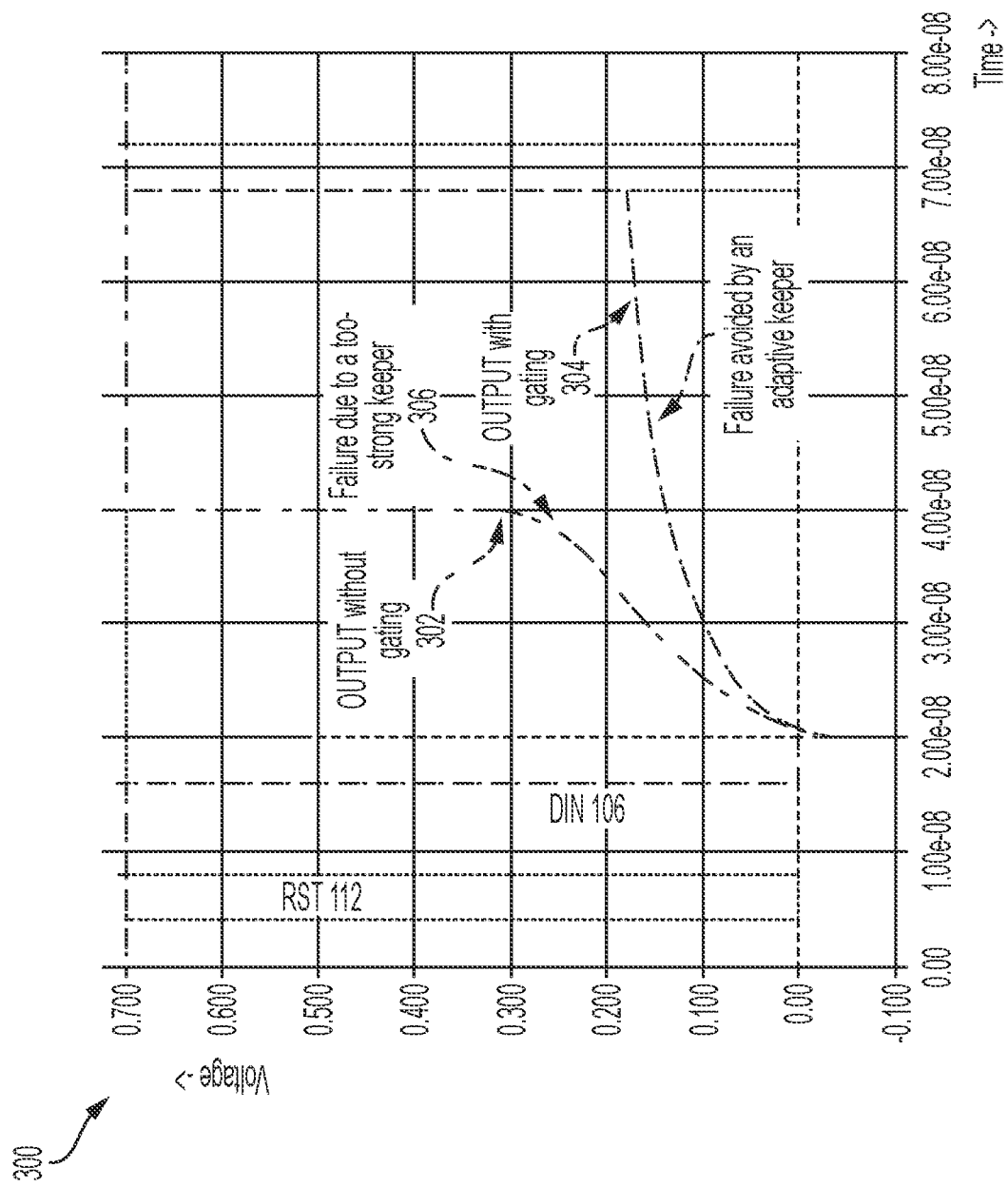
FIG. 3 depicts results of an output of a dynamic circuit with and without using an adaptive keeper circuit according to one or more embodiments of the present invention.

FIG. 3 depicts results of the output of the dynamic circuit 100 with and without using the adaptive keeper circuit 202 according to one or more embodiments of the present invention. X axis is the time and Y axis is the voltage. Curves for possible values of RST 112 and DIN 106 are shown in a plot 300. The curve 302 depicts the output 124 without using the adaptive keeper circuit 202. As can be seen, at point 306 and beyond, the keeper circuit 116 (without the adaptive circuit), continues to keep the output 124 high causing a failure. The adaptive keeper circuit 202 avoids the failure. Experiments performed by the inventors have shown that the adaptive keeper circuit reduces failure probability of the dynamic circuit 100 by at least 39%.

Embodiments of the present invention improve dynamic circuits by providing an adaptive keeper circuit that avoids pull-down and pull-up failures, which are caused when the keeper circuit is too strong or too weak compared to an input pulse to the dynamic circuit. Embodiments of the present invention adapt for input pulse amplitude by gating a voltage source of a previous stage circuit that provides input signal to the keeper circuit of the dynamic circuit to address such technical challenges. Accordingly, the keeper circuit is partially dependent on the supply voltage of the previous stage. As a result, the keeper circuit becomes stronger for a high-voltage input, and weaker for low-voltage input.

Embodiments of the present invention are advantageous over existing dynamically adjustable keeper circuits for several reasons, which include better robustness against local and global variations, and reduced area and wire congestion by not requiring the use of a global controller and its connectivity. Embodiments of the present invention improve the dynamic circuits by increase product lifetime, improve hardware debug options, and providing additional options to tune the design of the dynamic circuits.

Further, in one or more embodiments of the present invention, the adaptive keeper circuit 202 can enable support for two different supplies in the dynamic stage: CLK using a first voltage (e.g., VDDa) while the keeper circuit 202 uses a second voltage (e.g., VDDb). Such a support for two different voltage values can be useful for dynamic circuits used in memory arrays, for example.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An electrical circuit comprising:
   a driver circuit; and
   a receiver circuit, wherein the receiver circuit includes an evaluation circuit, an adaptive circuit, and a keeper circuit;
   wherein the adaptive circuit comprises a first adaptive circuit electrical path that includes a first NFET and a second NFET, and a second adaptive circuit electrical path that includes a first PFET and a second PFET, wherein the first NFET and the first PFET are connected to an adaptive circuit voltage supply, wherein the second NFET and the second PFET are connected to a pull-up transistor of the keeper circuit, wherein a gate of the first NFET and a gate of the second NFET are connected to a differential voltage of the driver circuit, and wherein a gate of the first PFET and a gate of the second PFET are connected to a gate of the pull-up transistor of the keeper circuit;
   wherein the evaluation circuit receives a clock signal and an input pulse from the driver circuit during a pre-charge phase;
   wherein the evaluation circuit generates an output pulse based on the clock signal and the input pulse during an evaluation phase; and
   wherein the keeper circuit maintains a charge of the output pulse until another evaluation phase, wherein the keeper circuit is adapted to the driver circuit by gating a first voltage supply of the driver circuit with a second voltage supply of the keeper circuit.

2. The electrical circuit of claim 1, wherein the gating uses a controllable node to connect the first voltage supply with the second voltage supply.

3. The electrical circuit of claim 1, wherein the gating uses a N-channel field effect transistor to connect the first voltage supply with the second voltage supply.

4. The electrical circuit of claim 1, wherein the driver circuit is a prior stage of the receiver circuit.

5. The electrical circuit of claim 4, wherein the electrical circuit is a memory device.

6. The electrical circuit of claim 4, wherein the electrical circuit is a register array.

7. A method comprising:
   providing, by a driver circuit, an input pulse to a receiver circuit during a pre-charge phase, wherein the receiver circuit includes an evaluation circuit, an adaptive circuit, and a keeper circuit;
   wherein the adaptive circuit comprises a first adaptive circuit electrical path that includes a first NFET and a second NFET, and a second adaptive circuit electrical path that includes a first PFET and a second PFET, wherein the first NFET and the first PFET are connected to an adaptive circuit voltage supply, wherein the second NFET and the second PFET are connected to a pull-up transistor of the keeper circuit, wherein a gate of the first NFET and a gate of the second NFET are connected to a differential voltage of the driver circuit, and wherein a gate of the first PFET and a gate of the second PFET are connected to a gate of the pull-up transistor of the keeper circuit;
   generating, by the evaluation circuit, an output pulse based on a clock signal and the input pulse during an evaluation phase; and
   keeping, by the keeper circuit, a charge of the output pulse until another input pulse is received by the receiver circuit, wherein the keeper circuit is adapted to the driver circuit by gating a first voltage supply of the driver circuit with a second voltage supply of the keeper circuit.

8. The method of claim 7, wherein the gating uses a controllable node to connect the first voltage supply with the second voltage supply.

9. The method of claim 7, wherein the gating uses a N-channel field effect transistor to connect the first voltage supply with the second voltage supply.

10. The method of claim 7, wherein the driver circuit and the receiver circuit are part of another circuit with the driver circuit being a prior stage of the receiver circuit.

11. The method of claim 10, wherein the another circuit is a memory device.

12. The method of claim 10, wherein the another circuit is a register array.

13. A keeper circuit comprising:
   a pull-up transistor, wherein the pull-up transistor is connected to an adaptive circuit comprising a first adaptive circuit electrical path that includes a first NFET and a second NFET, and a second adaptive circuit electrical path that includes a first PFET and a second PFET, wherein the first NFET and the first PFET are connected to an adaptive circuit voltage supply, wherein the second NFET and the second PFET are connected to the pull-up transistor, wherein a gate of the first NFET and a gate of the second NFET are connected to a differential voltage of a driver circuit, and wherein a gate of the first PFET and a gate of the second PFET are connected to a gate of the pull-up transistor;
   a first voltage supply;
   a second voltage supply; and
   a node that gates the first voltage supply and the second voltage supply, wherein the keeper circuit keeps a value of an output pulse of a dynamic circuit based on the gated first voltage supply and the second voltage supply.

14. The keeper circuit of claim 13, wherein the first voltage supply is of a driver circuit that provides an input pulse to the dynamic circuit.

15. The keeper circuit of claim 14, wherein the dynamic circuit generates the output pulse based on the input pulse from the driver circuit.

16. The keeper circuit of claim 15, wherein the value of the output pulse is kept robust in response to a change in amplitude of the input pulse.

17. The keeper circuit of claim 13, wherein the node is a N-channel field effect transistor.

18. The keeper circuit of claim 13, wherein the dynamic circuit uses a separate voltage supply.

* * * * *